(12) United States Patent
Haematsu

(10) Patent No.: US 6,504,190 B2
(45) Date of Patent: Jan. 7, 2003

(54) FET WHOSE SOURCE ELECTRODE OVERHANGS GATE ELECTRODE AND ITS MANUFACTURE METHOD

(75) Inventor: Hitoshi Haematsu, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/917,894

(22) Filed: Jul. 31, 2001

(65) Prior Publication Data

US 2002/0038894 A1 Apr. 4, 2002

(30) Foreign Application Priority Data

Sep. 29, 2000 (JP) .......................... 2000-299577

(51) Int. Cl.$^7$ ............................... H01L 29/80
(52) U.S. Cl. ................. 257/283; 257/280; 257/282; 257/284; 257/368; 257/213; 257/471
(58) Field of Search .............. 257/276, 73, 155, 257/260, 267, 280, 281, 282, 283, 284, 340, 360, 364, 365, 366, 367, 368, 409, 410, 449, 451, 452, 453, 454, 471, 476, 403, 484

(56) References Cited

U.S. PATENT DOCUMENTS

| | | | |
|---|---|---|---|
| 5,514,883 A | * 5/1996 | Nakatsuka et al. | 257/192 |
| 5,559,046 A | * 9/1996 | Oishi et al. | 438/167 |
| 5,585,288 A | * 12/1996 | Davis et al. | 435/171 |
| 5,614,762 A | * 3/1997 | Kanamori et al. | 257/192 |
| 5,818,077 A | * 10/1998 | Takahashi et al. | 257/276 |
| 5,940,694 A | * 8/1999 | Bozada et al. | 438/172 |
| 6,037,245 A | * 3/2000 | Matsuda | 438/586 |
| 6,081,006 A | * 6/2000 | Nelson | 257/276 |
| 6,100,554 A | * 8/2000 | Ishikawa et al. | 257/275 |
| 6,211,531 B1 | * 4/2001 | Nakazato et al. | 257/262 |
| 6,242,765 B1 | * 6/2001 | Nashimoto | 257/192 |

FOREIGN PATENT DOCUMENTS

JP      3-35536 A      2/1991

* cited by examiner

Primary Examiner—Nathan J. Flynn
Assistant Examiner—Pershelle Greene
(74) Attorney, Agent, or Firm—Armstrong, Westerman & Hattori, LLP

(57) ABSTRACT

A gate electrode is in Schottky contact with the surface of a semiconductor substrate and extends in a first direction. A drain electrode is disposed on one side of the gate electrode, spaced apart from the gate electrode by some distance, and is in ohmic contact with the semiconductor substrate. A source electrode is constituted of a main part, an overhanging part and a shielding part. The main part is in ohmic contact with the semiconductor substrate in the region across the gate electrode from the drain electrode. The shielding part is disposed between the gate electrode and the drain electrode and extends in the first direction. The overhanging part passes over the gate electrode and connects the shielding part with main part. The size of the overhanging part along the first direction is smaller than the side of the shielding part. It becomes possible to sufficiently shield the gate electrode from the drain electrode while suppressing an increase of the parasitic capacitance between the source and gate electrodes.

8 Claims, 4 Drawing Sheets

FET WHOSE SOURCE ELECTRODE OVERHANGS GATE ELECTRODE AND ITS MANUFACTURE METHOD

This application is based on Japanese Patent Application 2000-299577, filed on Sep. 29, 2000, the entire contents of which are incorporated herein by reference.

BACKGROUND OF THE INVENTION a) Field of the Invention

The present invention relates to a semiconductor device and its manufacture method, and more particularly to a field effect type semiconductor device having a Schottky gate electrode and being excellent in high frequency characteristics and to its manufacture method.

b) Description of the Related Art

FIG. 4A shows an example of a field effect transistor which is suitable for amplification in the high frequency bandwidth. On the surface of a semi-insulating GaAs substrate 100, a channel layer 101 is formed which is made of Si doped n-type GaAs. On this channel layer 101, a cap layer 102 is formed which is made of undoped GaAs. An opening 102a for a gate electrode is formed through the cap layer 102.

A gate electrode 105 is formed on the channel layer 101 exposed on the bottom of the opening 102a. The gate electrode 105 is in Schottky contact with the channel layer 101. A drain electrode 106 is formed on the cap layer 102 on one side of the gate electrode 105, whereas a source electrode 107 is formed on the cap layer 102 on the other side. The drain electrode 106 and source electrode 107 are in ohmic contact with the channel layer 101 via the cap layer 102. The source electrode 107 passes over the gate electrode 105 and extends near to the drain electrode 106.

FIG. 4B is a plan view of the field effect transistor shown in FIG. 4A. A cross sectional view taken along one-dot chain line A4—A4 shown in FIG. 4B corresponds to FIG. 4A. Two gate electrodes 105 are disposed in parallel. The source electrode 107 is disposed in an area between the two gate electrodes 105, and the both end portions thereof overlap the gate electrodes 105. The drain electrodes 106 are disposed outside of the two gate electrodes 105.

A portion of the source electrode 107 passing over the gate electrode 105 electrically shields the gate electrode 105 from the drain electrode 106. It is therefore possible to reduce a parasitic capacitance Cgd between the gate electrode and the drain electrode.

In the semiconductor device shown in FIGS. 4A and 4B, since the source electrode 107 covers the gate electrode 105, the parasitic capacitance Cgs between the gate electrode and source electrode increases. Therefore, the effect of improving the high frequency characteristics by reducing the parasitic capacitance Cgd between the gate electrode and drain electrode is lowered or may be cancelled out.

As shown in FIG. 4C, if the portion of the source electrode 107 covering the gate electrode 105 is made to have a comb tooth shape, the parasitic capacitance Cgs between the gate electrode and source electrode can be prevented from being increased. However, the shielding effect of the source electrode of the comb tooth shape is not sufficient because it has areas without a comb tooth. For example, the effect to shield the lines of electric force from the gate electrode 105 to the drain electrode 106 is small in the area without a comb tooth. The shielding effect becomes small particularly if the pitch between comb teeth is larger than ¼ of the wavelength of electromagnetic waves corresponding to the operation frequency.

SUMMARY OF THE INVENTION

It is an object of the present invention to provide a semiconductor device and its manufacture method, capable of sufficiently shielding the gate electrode from the drain electrode while suppressing an increase of the parasitic capacitance between the source electrode and gate electrode.

According to one aspect of the present invention, there is provided a semiconductor device, comprising: a semiconductor substrate; a gate electrode in Schottky contact with a surface of the semiconductor substrate, the gate electrode extending in a first direction; a drain electrode disposed on one side of the gate electrode, spaced apart from the gate electrode by some distance, and in ohmic contact with the semiconductor substrate; and a source electrode formed on the surface of the semiconductor device, the source electrode including a main part in ohmic contact with the semiconductor substrate in a region across the gate electrode from the drain electrode, a shielding part disposed between the gate and drain electrodes as viewed along a direction normal to the surface of the semiconductor substrate, the shielding part extending in the first direction, and an overhanging part passing over the gate electrode and connecting the shielding part with the main part, the size of the overhanging part along the first direction is smaller than the side of the shielding part.

The shielding part electrically shields the gate electrode from the drain electrode. The size of the overhanging part in the first direction is smaller than that of the shielding part. It is therefore possible to decrease the overlapped area between the gate and source electrodes and reduce the parasitic capacitance therebetween.

According to another aspect of the present invention, there is provided a semiconductor device, comprising: a semiconductor substrate; a gate electrode in Schottky contact with a surface of the semiconductor substrate, the gate electrode extending in a first direction; a drain electrode disposed on one side of the gate electrode, spaced apart from the gate electrode by some distance, and in ohmic contact with the semiconductor substrate; and a source electrode formed on the surface of the semiconductor device, the source electrode being in ohmic contact with the semiconductor substrate in a region across the gate electrode from the drain electrode, passing over the gate electrode, and extending to a space between the drain and gate electrodes, the source electrode having an opening partially overlapping the gate electrode as viewed along a direction normal to the surface of the semiconductor substrate.

Since the source electrode extends to a space between the drain and gate electrodes, the gate electrode can be electrically shielded from the drain electrode. Since the opening partially overlapping the gate electrode is formed through the source electrode, the overlapped area between the source and drain electrodes can be decreased and the parasitic capacitance therebetween can be reduced.

According to another aspect of the present invention, there is provided a method of manufacturing a semiconductor device, comprising the steps of: forming, on a surface of a semiconductor substrate, a gate electrode being in Schottky contact with the semiconductor substrate and extending in a first direction and first and second ohmic contact electrodes on both sides of the gate electrode disposed spaced apart from the gate electrode by some distance; covering the gate electrode and the surface of the semiconductor substrate on both sides of the gate electrode with a first resist pattern; forming a conductive groundwork layer on the resist pattern and the first and second ohmic electrodes; forming second and third resist patterns on the ground work layer, the second resist pattern being disposed at a position nearer to the first ohmic electrode than the gate electrode and extending in the first direction, the second resist pattern being disposed partially overlapping the first resist pattern as viewed along a direction normal to the substrate surface, the third resist pattern being disposed at position nearer to the second ohmic electrode than the second resist pattern and partially overlapping the gate electrode; plating conductive material on the groundwork layer by using the second and third resist patterns as a mask; removing the second and third resist patterns; removing the groundwork layer exposed on a bottom of an opening formed after the second and third resist patterns are removed; and removing the first resist pattern.

The plated layer on the first ohmic electrode functions as a drain electrode, and the plated layer on the second ohmic electrode functions as a source electrode. The plated layer formed in a space between the second resist pattern and the third resist pattern functions as a shielding part of the source electrode.

As above, the shielding part is disposed between the gate and drain electrodes to electrically shield the gate electrode from the drain electrode, so that the high frequency characteristics can be improved. The shielding part is made continuous with the source electrode main part by the overhanging part passing over the gate electrode. Since the overhanging part is made smaller than the shielding part along the gate width direction, it is possible to suppress an increase of the parasitic capacitance between the gate and source electrodes.

DETAILED DESCRIPTION OF THE PREFERRED EMBODIMENTS

A field effect transistor according to an embodiment of the invention will be described with reference to FIGS. 1A to 2B.

Figure 1A:
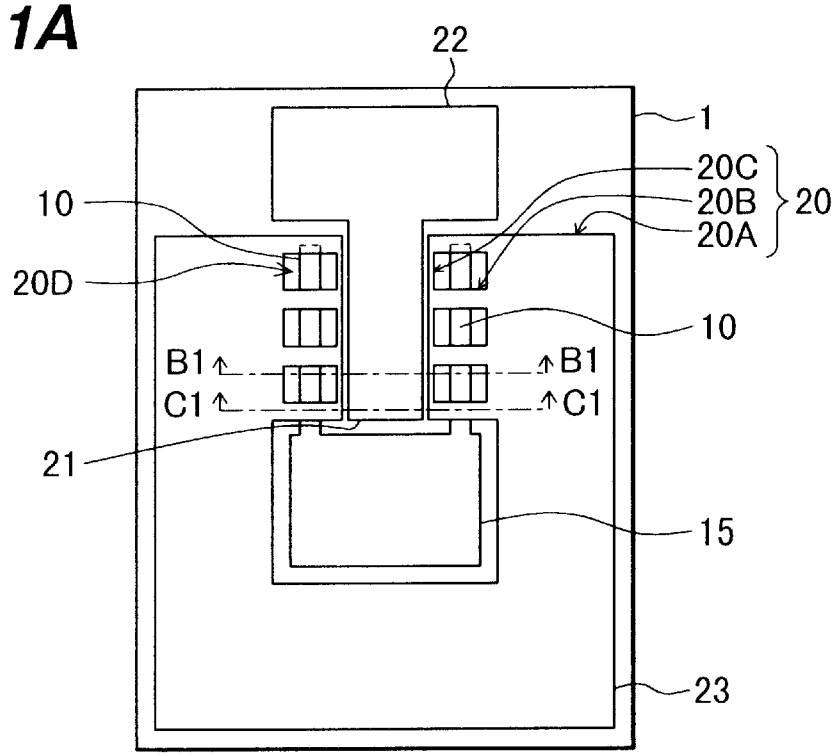
FIG. 1A is a plan view of a field effect transistor according to a first embodiment of the invention.

FIG. 1A is a plan view of a field effect transistor according the embodiment. Two gate electrodes 10 are disposed on the surface of a GaAs substrate. The two gate electrodes 10 are disposed in parallel with each other and extend in the vertical direction in FIG. 1A. One end (lower end in FIG. 1A) of each of the two gate electrodes 10 is continuous with a gate pad 15.

A drain electrode 21 is disposed between the two gate electrodes 10. An almost constant space is established between the drain electrode 21 and each gate electrode 10. One end of the drain electrode 21 is continuous with a drain pad 22.

Each of two source electrodes 20 is constituted of a main part 20A, an overhanging part 20B and a shielding part 20C. Each main part 20A is disposed across the gate electrode 10 from the drain electrode 21. The shielding part 20C is disposed between each gate electrode 10 and drain electrode 21, and extends in a direction in parallel to the gate electrode 10. Each of the source electrodes 20 has four overhanging parts 20B. Each overhanging part 20B crosses the corresponding gate electrode 10, and connects the main part 20A with shielding part 20C.

The two overhanging parts 20B located at both ends in the direction parallel to the gate electrode 10 are respectively connected to the opposite end portions of the shielding part 20C. The adjacent two overhanging parts 20B, shielding part 20c and main part 20A define openings 20D surrounded by these parts. Each opening 20D partially overlaps the gate electrode 10.

The two main parts 20A are continuous with a source pad 23. The source pad 23 is disposed across the gate pad 15 from the drain electrode 21.

Figure 1B:
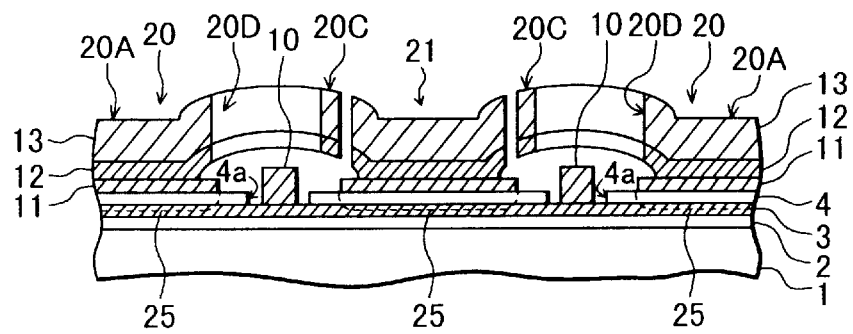
FIGS. 1B and 1C are cross sectional views of the field effect transistor shown in FIG. 1A.
Figure 1C:
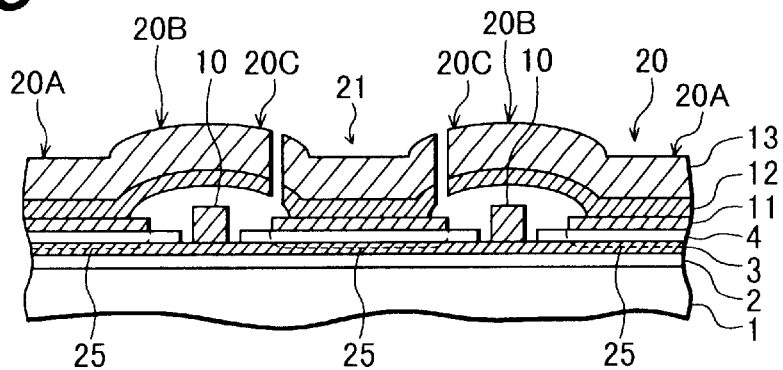

FIGS. 1B and 1C are cross sectional views respectively taken along one-dot chain lines B1—B1 and C1—C1 in FIG. 1A. On the surface of a semi-insulating GaAs substrate 1, a buffer layer 2 made of undoped GaAs is formed. On the buffer layer 2, a channel layer 3 is formed which is made of n-type GaAs and has a thickness of 200 nm. N-type impurities doped in the channel layer 3 are Si and its concentration is $1\times10^{17}$ cm$^{-3}$.

On the channel layer 3, a cap layer 4 is formed which has a thickness of 100 nm and made of undoped GaAs. Two openings 4a are formed through the cap layer 4, the opening extending in a direction perpendicular to the surface of the drawing. The channel layer 3 is exposed on the bottoms of the openings 4a. On the channel layer 3 exposed on the bottoms of the openings 4a, gate electrodes 10 of tungsten silicide (WSi) are formed. A Schottky junction is formed at the interface between the gate electrode 10 and channel layer 3. The gate length is about 0.5 μm.

An ohmic contact layer 11 is formed on the cap layer 4. The ohmic contact layer 11 has a two-layer structure of an AuGe layer of 50 nm in thickness and an Au layer of 150 nm in thickness stacked in this order. The edge of the ohmic contact layer 11 on the side of the gate electrode 10 is slightly retracted from the inner wall of the opening 4a, and is spaced apart from the sidewall of the gate electrode 10 by about 2 μm.

A contact region 25 diffused with AuGe is formed under each of the ohmic contact layers 11. The contact region 25 reaches the inside of the channel layer 3 to electrically contact the ohmic contact layer 11 with channel layer 3.

A drain electrode 21 is formed on the ohmic contact layer 11 between the two gate electrodes 10. On each of the ohmic contact layers 11 disposed across the gate electrode 10 from the drain electrode 21, a main part 20A of the source electrode 20 is formed. The shielding part 20C is supported by the overhanging parts 20B over the substrate surface between the gate electrode 10 and drain electrode 21.

The shielding part 20C faces the sidewall of the drain electrode 21, and a gap therebetween is about 1 μm. The overhanging parts 20B pass over the gate electrode 10. One ends of the overhanging parts 20B are continuous with the main part 20A and the other ends thereof are continuous with the shielding part 20C. A height from the upper surface of the gate electrode 10 to the lower surface of the overhanging parts 20B is about 1.2 μm. Each rectangular opening 20D shown in FIG. 1A has a side length of 6 μm in the gate width direction (the vertical direction in FIG. 1A) and a side length of 3 µm in the gate length direction (the horizontal direction in FIG. 1A).

The source electrode 20 and drain electrode 21 each have the lamination structure of a plating groundwork layer 12 and a gold-plated layer 13. The plating groundwork layer 12 has a two-layer structure of a Ti layer of 100 nm in thickness and an Au layer of 100 nm in thickness stacked in this order. A thickness of the gold-plated layer is about 3 µm.

In this embodiment, the shielding part 20C is disposed between the gate electrode 10 and drain electrode 21. The potential of the shielding part 20C is fixed to the potential of the source electrode 20. Therefore, the gate electrode 10 is electrically shielded from the drain electrode 21, so that the gate electrode 10 is not susceptible to a voltage fluctuation of the drain electrode 21.

The shielding part 20C is continuously disposed from its one end to the other end in a stripe region sandwiched between the gate electrode 10 and drain electrode 21. Therefore, even if the size of the opening 20D is ¼ or more of the wavelength of electromagnetic waves corresponding to the operation frequency, a sufficient shielding effect can be demonstrated.

The operation frequency of a field effect transistor can be specified from the size and the like of an impedance match circuit connected with the gate electrode or drain electrode, e.g., the size and the like of a wave guide line pattern. The operation frequency might be able to be presumed from the channel length, channel impurity concentration, and the like of a field effect transistor.

Since the openings 20D are formed through the source electrode 20 as shown in FIG. 1A, an overlapping area between the gate electrode 10 and source electrode 20 is small as viewed along the substrate normal direction. Therefore, as compared to the case wherein almost all the area of the gate electrode overlaps the source electrode, the parasitic capacitance between the gate electrode and source electrode can be reduced. Furthermore, because surroundings of the gate electrode 10 are made a cave, the high frequency characteristics can be improved more than the case where the gate electrode is covered with dielectric material.

Next, a method of manufacturing the field effect transistor of the embodiment shown in FIGS. 1A to 1C will be described with reference to FIGS. 2A and 2B.

Figure 2A:
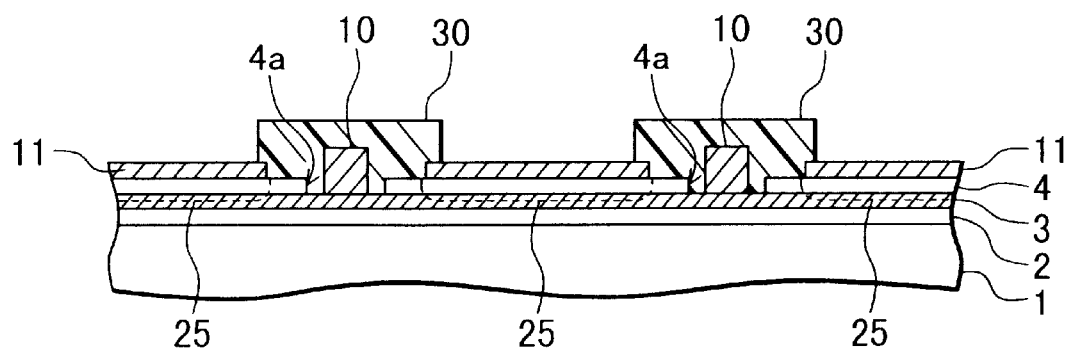
FIGS. 2A and 2B are cross sectional views of a substrate illustrating a method of manufacturing the field effect transistor of the first embodiment.

As shown in FIG. 2A, on the surface of a semi-insulating GaAs substrate 1, a buffer layer 2 made of undoped GaAs is formed. On this buffer layer 2, a channel layer 3 is formed which is made of Si doped n-type GaAs. On the channel layer 3, a cap layer 4 of undoped GaAs is formed. These GaAs layers are formed by metal organic chemical vapor deposition (MOCVD).

The cap layer 4 in partial areas is etched to form openings or grooves 4a. The depth of this groove 4a can be easily controlled by forming an etching stopper layer of AlGaAs and about 20 nm in thickness between the channel layer 3 and cap layer 4. For example, the cap layer 4 is dry-etched by using chlorine containing gas, and the etching stopper layer is wet-etched by using hydrochloric acid or the like. By wet-etching the etching stopper layer, the channel layer 3 is exposed on the bottom of the groove 4a.

Gate electrodes 10 of WSi are formed on the bottom of the grooves 4a. The gate electrode 10 is formed by forming a WSi layer of 500 nm in thickness by sputtering and thereafter patterning the WSi layer. In patterning the WSi layer, dry etching using a mixture gas of $CF_4$ and $O_2$ as etching gas is performed.

Ohmic contact layers 11 having a two-layer structure of AuGe/Au are formed on the cap layers 4 on both sides of the groove 4a. A method of forming the ohmic contact layers 11 will be described briefly. First, a resist pattern is formed which has openings corresponding to the regions where the ohmic contact layer 11 should be disposed. On this resist pattern, an AuGe layer of 50 nm in thickness and an Au layer of 150 nm in thickness are deposited. The resist pattern is removed to lift off the AuGe/Au layer formed on the resist pattern. The ohmic contact layers 11 are therefore left in the regions corresponding to the openings of the resist pattern. The edges of the ohmic contact layers 11 on the gate electrode 10 side are retracted from the inner wall of the groove 4a.

A heat treatment is performed at a temperature of 450° C. for alloying. With this heat treatment, AuGe diffuses into the cap layer 4 and channel layer 3 so that ohmic contact regions 25 are formed.

As shown in FIG. 2A, a resist pattern 30 is formed covering the gate electrode 10 and its nearby surface. The resist pattern 30 covers the edge portions of the ohmic contact layers 11 on the gate electrode 10. A heat treatment is performed to change the shape of the resist pattern 30.

Figure 2B:
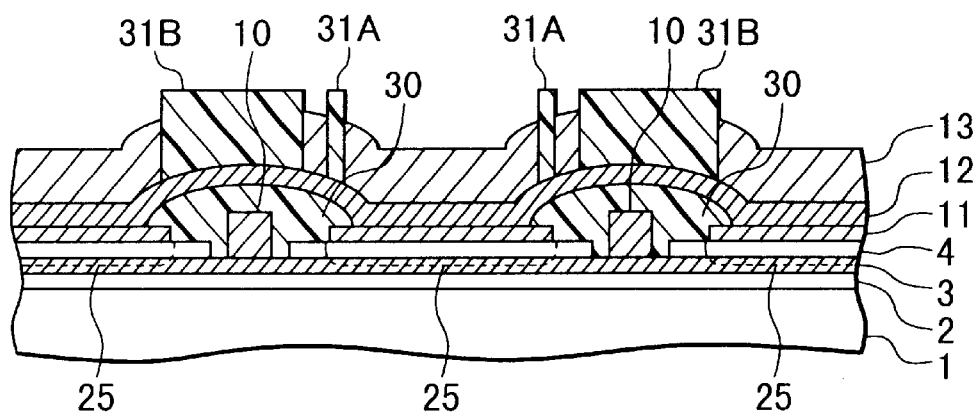

As shown in FIG. 2B, the upper surface of the resist pattern 30 becomes a smooth curved surface with the raised central part.

A plating groundwork layer 12 is formed on the resist pattern 30 and ohmic contact layers 11. The plating groundwork layer 12 has a two-layer structure of a Ti layer of 100 nm in thickness and an Au layer of 100 nm in thickness. The Ti and Au layers are formed by sputtering or vacuum evaporation deposition.

Resist pattern 31A and 31B are formed on the plating groundwork layer 12. The resist pattern 31A corresponds to the stripe region between the shielding part 20C and drain electrode 21 shown in FIG. 1A, and the resist pattern 31B corresponds to the opening 20D. The other regions excepting the drain electrode 21, drain pad 22, source electrode 20 and source pad 23, are also covered with the resist pattern. The resist pattern 31A overlaps the underlying resist pattern 30 near at the boundary thereof on the drain electrode side. The resist pattern 31B is located at a position nearer to the gate electrode 10 side than the resist pattern 31A.

FIG. 2B corresponds to a cross sectional view taken along one-dot chain line B1—B1 shown in FIG. 1A. The resist pattern 31B corresponding to the opening 20D is therefore shown above the gate electrode 10. By using the plating groundwork layer 12 as an electrode, an Au layer 13 of 3 µm in thickness is formed on the plating groundwork layer 12 by electrolysis plating. After the electrolysis plating, the resist patterns 31A and 31B are removed.

As shown in FIGS. 1B and 1C , after the resist patterns 31A and 31B are removed, the exposed plating groundwork layer 12 is removed by milling or the like. In this case, the Au-plated layer 13 is used as the mask. Under the removed groundwork layer 12, the resist pattern 30 is exposed. This resist pattern 30 is removed by ozone ashing or the like. As shown in FIGS. 1A and 1B, since the source electrodes 20 has the openings 20D, the resist pattern 30 can be removed easily.

In the first embodiment, four overhanging parts 20B are formed. However, the number of overhanging parts 20B is not limited to four, but three or five or more overhanging parts 20B may be formed. For example, two overhanging parts continuous with the opposite ends of the shielding part 20C and one overhanging part continuous with the central side of the shielding part 20C may be formed. Since it is not necessary to adjust the size of the opening 20D to ¼ or less of the wavelength of electromagnetic waves corresponding to the operation frequency, the layout of overhanging parts can be determined without any restriction of the wavelength.

Next, a field effect transistor according to a second embodiment will be described with reference to FIG. 3.

Figure 3:
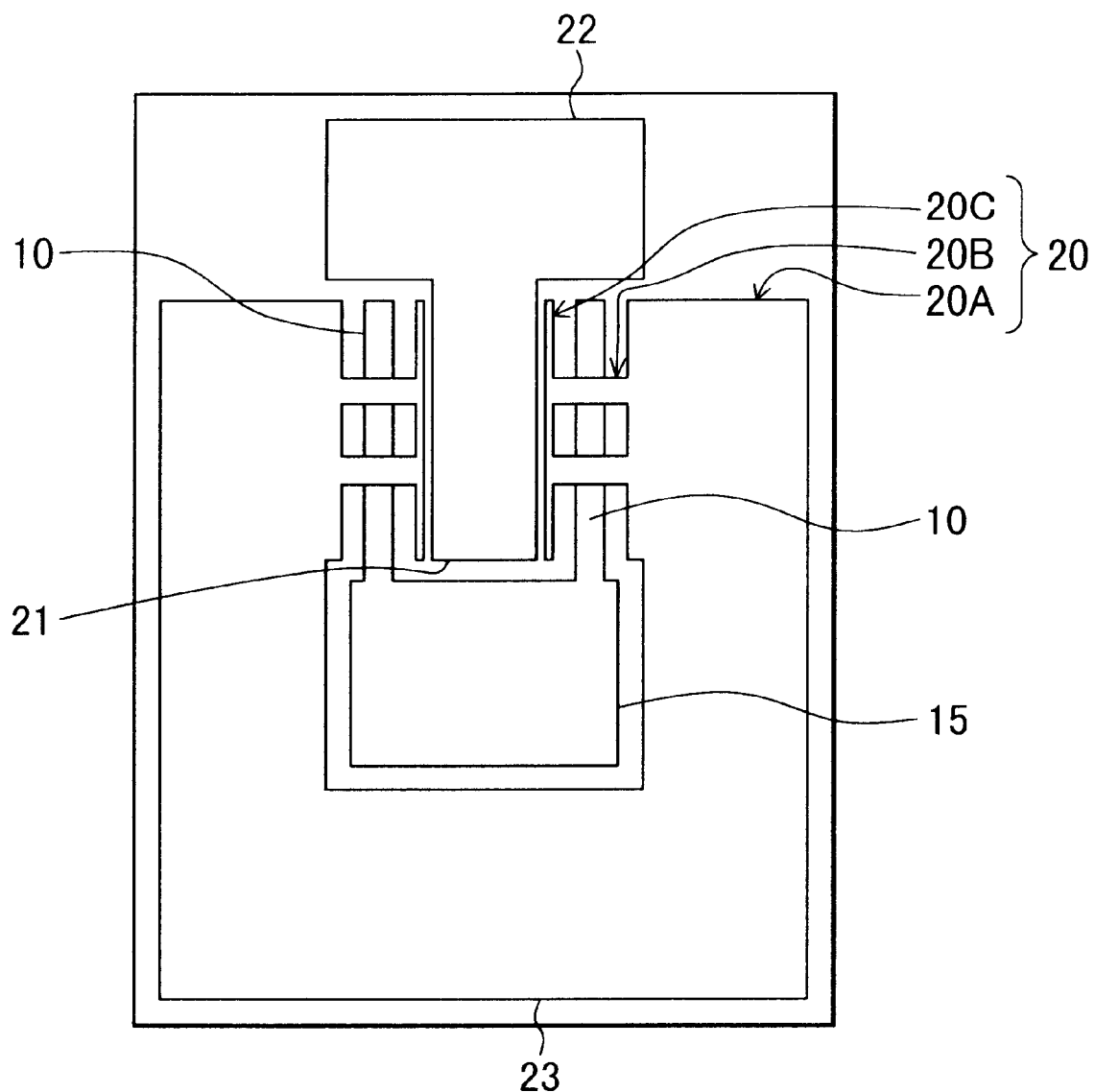
FIG. 3 is a plan view of a field effect transistor according to a second embodiment of the invention.
Figure 4A:
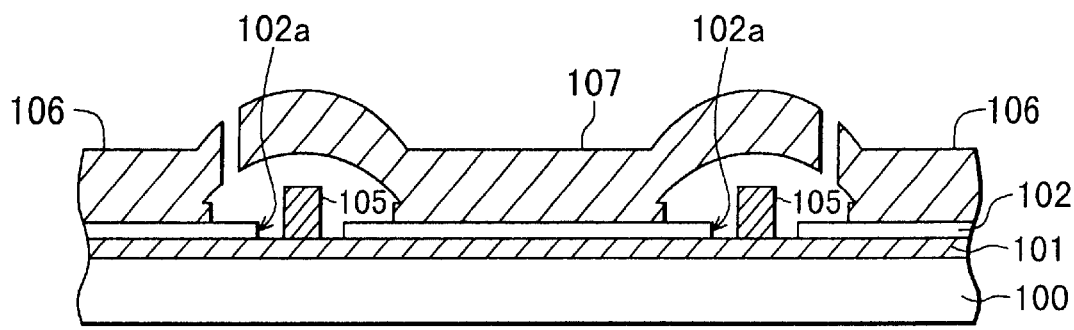
FIG. 4A is a cross sectional view of a conventional field effect transistor.
Figure 4B:
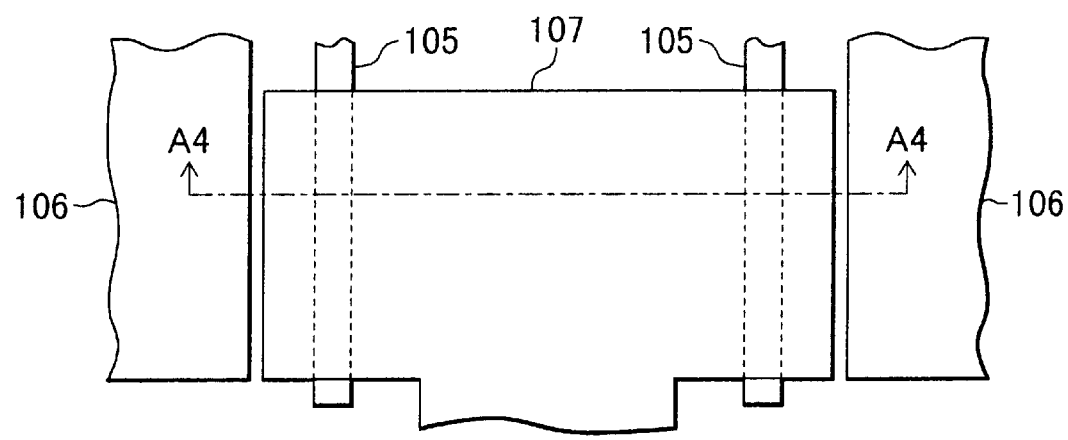
FIGS. 4B and 4C are cross sectional views of the field effect transistor shown in FIG. 4A.
Figure 4C:
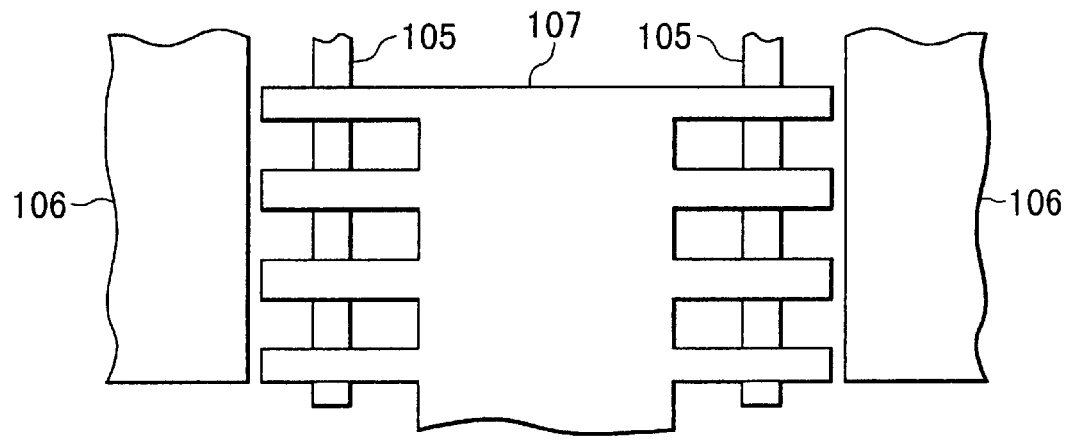

FIG. 3 is a plan view of the field effect transistor according to the second embodiment. In the first embodiment, as shown in FIG. 1A, the two overhanging parts 20B are connected to the opposite end portions of the shielding part 20C. In the second embodiment, opposite end portions of a shielding part 20C is not supported by overhanging parts 20B, but the shielding part 20C is supported by two overhanging parts 20B only at positions other than the opposite end portions. Only one overhanging part 20B may be used. The other structures are similar to those of the first embodiment.

Also in the second embodiment, similar to the first embodiment, the shielding part 20C is disposed between the gate electrode 10 and drain electrode 21 over almost all the region of the gate electrode 10 in the gate width direction. A sufficient shielding effect can therefore be obtained. In the second embodiment, since the number of overhanging parts 20B is smaller than the number of overhanging parts 20B of the first embodiment, the parasitic capacitance between the gate electrode and source electrode can be reduced more.

Conversely, since the number of overhanging parts 20B of the first embodiment for connecting the shielding part 20C with main part 20A is larger than the second embodiment, inductance between the shielding part 20C and main part 20A can be reduced. Further, since the shielding part 20C is supported at its opposite end portions, the shielding part 20C can be more stably supported.

In the above embodiments, a field effect transistor using a GaAs substrate is used by way of example. In place of the GaAs substrate, a compound semiconductor substrate having a high electron mobility may be used. In the above embodiments, although MESFET is used by way of example, the structures of the source electrodes of the embodiments are also applicable to a high electron mobility transistor (HEMT).

The present invention has been described in connection with the preferred embodiments. The invention is not limited only to the above embodiments. It is apparent that various modifications, improvements, combinations, and the like can be made by those skilled in the art.

I claim:

1. A semiconductor device, comprising:

a semiconductor substrate;

a gate electrode in Schottky contact with a surface of the semiconductor substrate, the gate electrode extending in a first direction;

a drain electrode disposed on one side of the gate electrode, spaced apart from the gate electrode by some distance, and in ohmic contact with the semiconductor substrate; and a source electrode formed on the surface of the semiconductor substrate, the source electrode including:

a main part in ohmic contact with the semiconductor substrate in a region across the gate electrode from the drain electrode, a shielding part disposed between the gate and drain electrodes as viewed along a direction normal to the surface of the semiconductor substrate, the shielding part extending in the first direction, and an overhanging part passing over the gate electrode and connecting the shielding part with the main part, wherein the total dimension of the overhanging part along the first direction is smaller than a total dimension of the shielding part along the first direction.

2. A semiconductor device according to claim 1, wherein a plurality of overhanging parts are disposed, opposite two overhanging parts are connected to opposite end portions of the shielding part.

3. A semiconductor device according to claim 1, wherein a cave is formed between the surface of the semiconductor substrate and a set of the shielding part and overhanging part.

4. A semiconductor device according to claim 1, wherein a sidewall of the shielding part on a side of the drain electrode faces a portion of a sidewall of the drain electrode on a side of the gate electrode by some distance therebetween.

5. A semiconductor device, comprising:

a semiconductor substrate;

a gate electrode in Schottky contact with a surface of the semiconductor substrate, the gate electrode extending in a first direction;

a drain electrode disposed on one side of the gate electrode, spaced apart from the gate electrode by some distance, and in ohmic contact with the semiconductor substrate; and a source electrode formed on the surface of the semiconductor substrate, the source electrode being in ohmic contact with the semiconductor substrate in a region across the gate electrode from the drain electrode, passing over the gate electrode, and extending to a space between the drain and gate electrodes, the source electrode having an opening partially overlapping the gate electrode as viewed along a direction normal to the surface of the semiconductor substrate.

6. A semiconductor device according to claim 5, wherein a size of the opening in the first direction is larger than one fourth of the wavelength of electromagnetic waves corresponding to an operation frequency.

7. A semiconductor device according to claim 5, wherein a sidewall of the source electrode on the side of the drain electrode faces a portion of a sidewall of the drain electrode on the side of the gate electrode by some distance therebetween.

8. A semiconductor device according to claim 5, wherein the opening is located inside the source electrode.

* * * * *